US012775032B2

(12) United States Patent
Croxall et al.

(10) Patent No.: US 12,775,032 B2
(45) Date of Patent: Oct. 27, 2026

(54) MEASURING AN OPEN CIRCUIT VOLTAGE OF A BATTERY

(71) Applicant: QUALCOMM Incorporated, San Diego, CA (US)

(72) Inventors: Andrew Croxall, Cambridge (GB); Richard Nguyen, Burghaslach (DE)

(73) Assignee: Qualcomm Incorporated, San Diego, CA (US)

( * ) Notice: Subject to any disclaimer, the term of this patent is extended or adjusted under 35 U.S.C. 154(b) by 155 days.

(21) Appl. No.: 18/420,312

(22) Filed: Jan. 23, 2024

(65) Prior Publication Data

US 2025/0237682 A1 Jul. 24, 2025

(51) Int. Cl.

| | |
|---|---|
| ***G01R 19/25*** | (2006.01) |
| ***G01R 19/165*** | (2006.01) |
| ***G01R 19/257*** | (2006.01) |
| ***G01R 31/388*** | (2019.01) |

(52) U.S. Cl.

CPC .................... *G01R 19/2509* (2013.01); *G01R 19/16542* (2013.01); *G01R 19/257* (2013.01); *G01R 31/388* (2019.01)

(58) Field of Classification Search

CPC .......... G01R 19/16542; G01R 19/2509; G01R 19/257; G01R 31/3644; G01R 31/388; G01R 31/387; G01R 31/3842; G01R 31/3646; G01R 31/382; G01R 31/385; G01R 31/392; H02J 2310/48; H02J 7/0047; H02J 7/00; H02J 7/0048; H02J 7/00711; B60L 3/0046; B60L 3/12; Y02E 60/50; Y02E 60/10

See application file for complete search history.

(56) References Cited

U.S. PATENT DOCUMENTS

| | | | | |
|---|---|---|---|---|
| 4,587,443 | A | 5/1986 | van de Plassche | |
| 4,833,345 | A | 5/1989 | Miller | |
| 5,144,160 | A | 9/1992 | Lee et al. | |
| 8,237,411 | B2 * | 8/2012 | Liu | H01M 10/441 320/136 |
| 8,401,728 | B2 * | 3/2013 | Kubo | H02J 7/00302 324/522 |

(Continued)

OTHER PUBLICATIONS

Gasparik F., "A Precision Autozeroing Sample and Hold Integrated Circuit", IEEE Journal of Solid-State Circuits, IEEE, USA, vol. 15, No. 6, Dec. 1, 1980, XP011422117, pp. 945-949, figures 1-3.

(Continued)

*Primary Examiner* — Vinh P Nguyen

(74) *Attorney, Agent, or Firm* — Gerald P. Joyce, III

(57) ABSTRACT

Techniques and apparatus for accurately measuring an open circuit voltage of a battery included in a battery-powered device are provided. One example apparatus generally includes a sample-and-hold circuit configured to sample a voltage of a battery before loading the battery and to hold the sampled voltage of the battery; an analog-to-digital converter (ADC) selectively coupled to an output of the sample-and-hold circuit and configured to digitize the held voltage of the battery; and a controller configured to enable the ADC for digitizing the held voltage of the battery after the sample-and-hold circuit samples the voltage of the battery.

20 Claims, 7 Drawing Sheets

(56) References Cited

U.S. PATENT DOCUMENTS

| | | | | |
|---|---|---|---|---|
| 9,026,387 | B2 * | 5/2015 | Vilhauer | G01R 19/16542 702/121 |
| 9,121,910 | B2 * | 9/2015 | Maluf | G01R 31/3648 |
| 9,500,714 | B2 * | 11/2016 | Rotem | G01R 31/3648 |
| 9,878,633 | B2 * | 1/2018 | Hwang | B60L 58/12 |
| 10,802,078 | B2 * | 10/2020 | Tamegai | G01R 19/16542 |
| 12,379,425 | B2 * | 8/2025 | Honda | H02J 7/0048 |
| 2010/0138176 | A1 | 6/2010 | Yu | |
| 2012/0253714 | A1 | 10/2012 | Vilhauer et al. | |

OTHER PUBLICATIONS

International Search Report and Written Opinion—PCT/US2024/061710—ISA/EPO—Mar. 27, 2025.

* cited by examiner

MEASURING AN OPEN CIRCUIT VOLTAGE OF A BATTERY

TECHNICAL FIELD

Certain aspects of the present disclosure generally relate to electronic devices having a battery. More particularly, the present disclosure relates to methods and apparatuses (e.g., circuits) for measuring a voltage of the battery while the battery is not loaded to obtain an accurate open circuit voltage measurement.

BACKGROUND

Power management integrated circuits (power management ICs or PMICs) may be used in battery-operated devices, such as smartphones, tablets, laptops, wearables, Internet of Things (IoT) devices, etc. A PMIC may perform a variety of functions for a battery of a battery-operated device. For example, the PMIC may measure a voltage of the battery. The measured voltage of the battery may be used to estimate the state of charge (SoC) of the battery. Based on the estimated SoC of the battery, the PMIC may control operation of the device (e.g., to conserve battery power when the SoC falls below a first, higher threshold value). Furthermore, the PMIC may shut down (e.g., power off) the battery-operated device when the estimated SoC of the battery falls below a second, lower threshold value.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure are directed to an apparatus. The apparatus generally includes: a sample-and-hold circuit configured to sample a voltage of a battery before loading the battery and to hold the sampled voltage of the battery; an analog-to-digital converter (ADC) selectively coupled to an output of the sample-and-hold circuit and configured to digitize the held voltage of the battery; and a controller configured to enable the ADC for digitizing the held voltage of the battery after the sample-and-hold circuit samples the voltage of the battery.

Certain aspects of the present disclosure are directed to a wireless device including the apparatus described herein.

Certain aspects of the present disclosure provide a wearable device including the apparatus described herein.

Certain aspects of the present disclosure are directed to an Internet of Things (IoT) device including the apparatus described herein.

Certain aspects of the present disclosure are directed to an integrated circuit (IC) including the apparatus described herein.

Certain aspects of the present disclosure are directed to a system on a chip including the apparatus described herein.

Certain aspects of the present disclosure are directed to an apparatus. The apparatus generally includes: means for sampling a voltage of a battery before loading the battery; means for holding the sampled voltage of the battery; means for digitizing the held voltage of the battery after loading the battery; and means for taking one or more actions based on the digitized voltage of the battery.

Certain aspects of the present disclosure are directed to a method of supplying power. The method generally includes: sampling a voltage of a battery before loading the battery; holding the sampled voltage of the battery; digitizing the held voltage of the battery with an analog-to-digital converter (ADC) after loading the battery; and taking one or more actions based on the digitized voltage of the battery.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
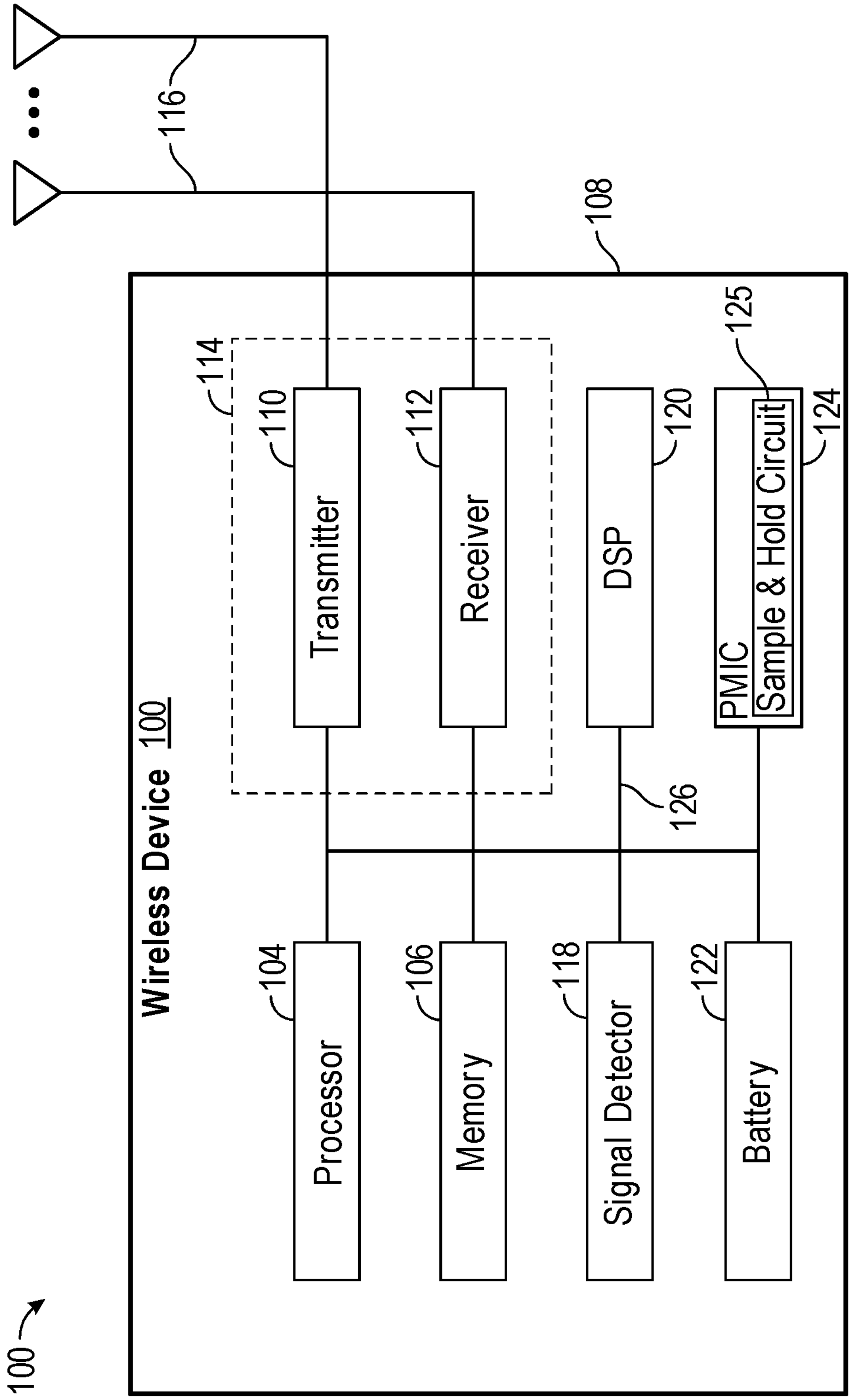
FIG. 1 is a block diagram of an example device that includes a sample-and-hold circuit for measuring an open circuit voltage of a battery, in which aspects of the present disclosure may be implemented.

Fuel gauging algorithms, which provide a state of charge (SoC) estimation for a battery based on an open circuit voltage (OCV) of the battery, are particularly important for wearable devices and Internet of Things (IoT) devices where battery life is of great concern. Conventional fuel gauging algorithms sample the OCV when the battery is loaded (e.g., during chip boot-up sequence) and can be inaccurate, since the battery voltage measurement is not a true OCV and/or may likely not be in equilibrium (e.g., due to inrush currents initially charging chip capacitors, such as power supply decoupling capacitors). However, since the OCV is most accurate when the battery is not loaded and is in equilibrium and since a small OCV error can lead to a large SoC error, the OCV measurement used by conventional fuel gauging algorithms cannot be considered to reflect the true SoC of the battery.

In view of the above, certain aspects of the present disclosure provide methods and apparatuses for sampling the OCV of the battery before boot-up of a device powered by the battery (e.g., before loading the battery) and while the battery is in equilibrium. The sampled OCV may be held while the device powered by the battery boots up. The sampled and held OCV of the battery may then be digitized (e.g., using an analog-to-digital converter) and used by fuel gauging algorithms for battery management, such as SoC estimation. In this manner, the methods and apparatus disclosed herein may provide SoC estimations based on an accurate OCV of the battery, which may therefore improve the fuel gauging algorithms and the customer experience therewith.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Device

FIG. 1 illustrates a device 100. The device 100 may be a battery-operated device such as a cellular phone, a personal digital assistant (PDA), a handheld device, a wireless modem, a smartphone, a tablet, a laptop computer, a personal computer, a wearable device (e.g., earbuds), an Internet of Things (IoT) device, etc. The device 100 is an example of a device that may be configured to implement the various systems and methods described herein.

The device 100 may include a processor 104 which controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106. The instructions in the memory 106 may be executable to implement the methods described herein.

The device 100 may also include a transmitter 110 and a receiver 112 to allow transmission and reception of data between the device 100 and a remote location. The transmitter 110 and receiver 112 may be combined into a transceiver 114. A plurality of antennas 116 may be attached to a housing 108 and electrically coupled to the transceiver 114. The device 100 may also include (not shown) multiple transmitters, multiple receivers, and multiple transceivers.

The device 100 may also include a signal detector 118 that may be used in an effort to detect and quantify the level of signals received by the transceiver 114. The signal detector 118 may detect such signals as total energy, energy per subcarrier per symbol, power spectral density and other signals. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, voltage regulation, battery charging, power-source selection, voltage scaling, power sequencing, etc. In certain aspects, the PMIC 124 may include a sample-and-hold circuit 125 operable to measure an open circuit voltage of the battery 122 before the battery is significantly loaded (e.g., before boot-up of other circuits in the device). Details of the sample-and-hold circuit 125 will be discussed in more detail with reference to FIGS. 3A, 3B, 4, and 5.

The various components of the device 100 may be coupled together by a bus system 126, which may include a power bus, a control signal bus, and a status signal bus in addition to a data bus.

Example Process for Measuring an Open Circuit Voltage of a Battery

Figure 2:
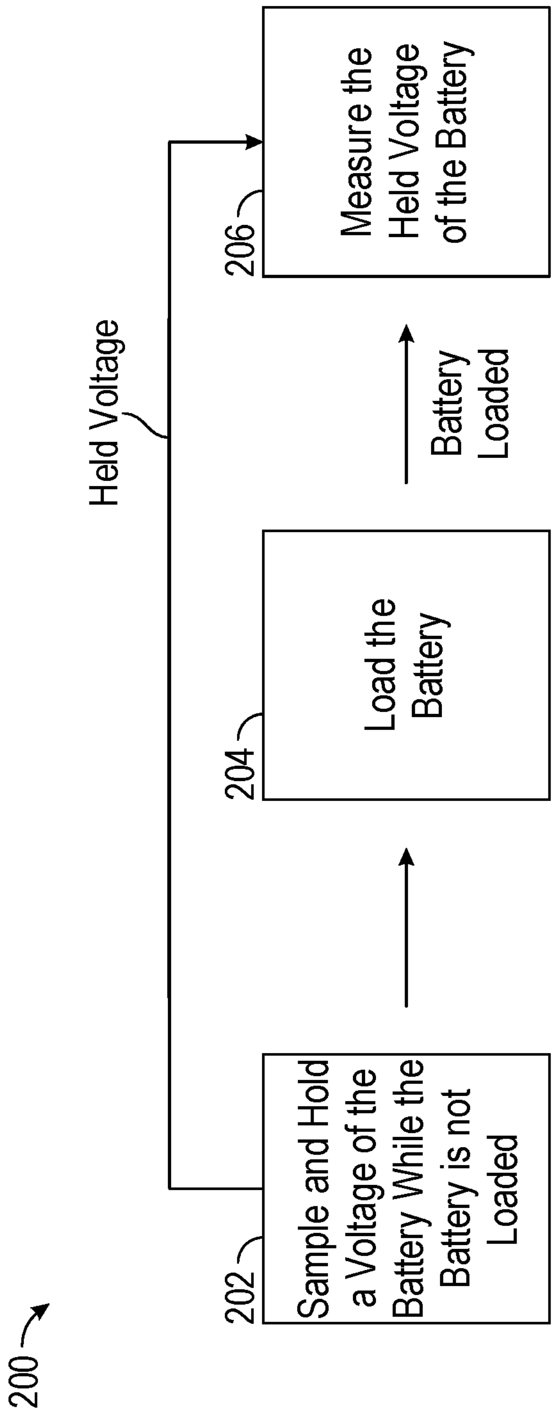
FIG. 2 is a flow diagram illustrating an example process for measuring an open circuit voltage of a battery, in accordance with certain aspects of the present disclosure.

FIG. 2 is a flow diagram of example operations 200 for obtaining an open circuit voltage of a battery of a battery-powered device according to certain aspects of the present disclosure. The operations 200 may, for example, be performed by a sample-and-hold circuit (e.g., of an integrated circuit (IC) in the battery-powered device), such as the sample-and-hold circuits described below with reference to FIGS. 3A, 3B, 4, and 5.

Operation 202 includes sampling a voltage of the battery while the battery is not loaded (e.g., before battery loading and while the battery is in equilibrium). For example, the voltage of the battery may be sampled before a boot-up sequence associated with an integrated circuit (IC) (e.g., a system on a chip) included in the battery-powered device and before the battery is loaded. More particularly, the voltage of the battery may be sampled without any inrush currents that are associated with initially loading the battery. In this manner, the sampled voltage of the battery may be indicative of an open circuit voltage of the battery which, as discussed above, may be used to more accurately estimate a state of charge (SoC) of the battery. Operation 202 may further include holding the sampled voltage of the battery. During operation 202, the circuit may be powered by (i) a power supply without a capacitor (e.g., a decoupling capacitor) or (ii) the battery itself, to perform the sampling and initial holding of the battery voltage before any significant current load is applied to the battery.

Operation 204 includes loading the battery. For example, the battery may be connected to the IC (or at least to other portions besides the sample-and-hold circuit), and the boot-up sequence associated with the IC may be initiated. More particularly, the boot-up sequence may enable one or more circuits included in the IC (e.g., in the system on a chip). For example, the one or more circuits enabled may include an analog-to-digital converter.

Operation 206 includes measuring or otherwise determining the held voltage of the battery. For example, the analog-to-digital converter included in the IC may be powered on and enabled as part of the boot-up sequence of the IC and may then digitize the held voltage of the battery. One or more actions may be taken based on the digitized battery voltage. For example, the one or more actions may include storing the digitized battery voltage in a memory (e.g., memory 106 or other memory in a system on a chip). Alternatively, or additionally, the one or more actions may include determining the SoC of the battery (e.g., from a lookup table (LUT)) based on the digitized battery voltage and/or limiting one or more capabilities of the battery-powered device based on the digitized battery voltage being below a threshold voltage.

Example Sample-and-Hold Circuits for OCV

Figure 3A:
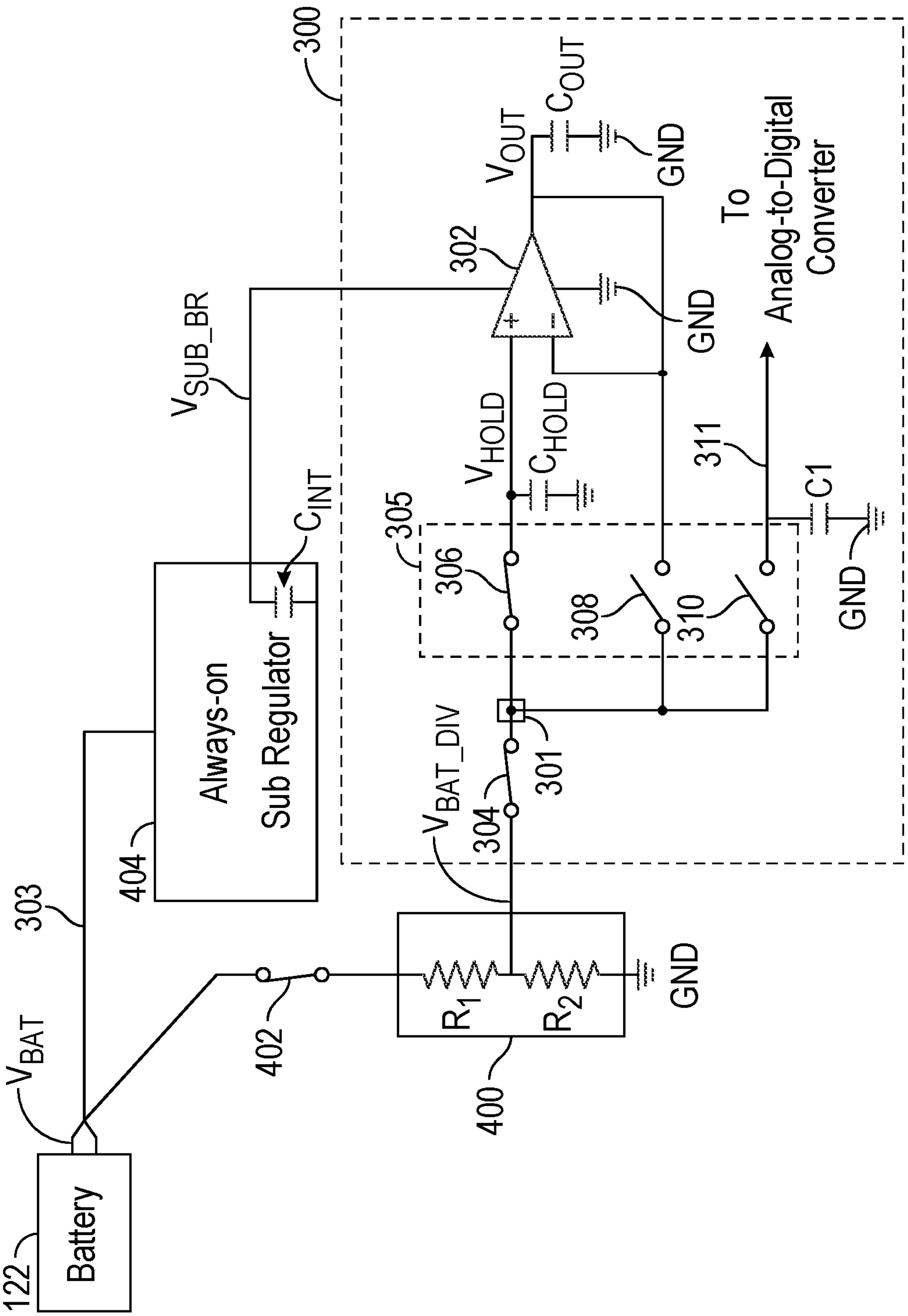
FIG. 3A is a circuit diagram of an example sample-and-hold circuit in a sample configuration, in accordance with certain aspects of the present disclosure.
Figure 3B:
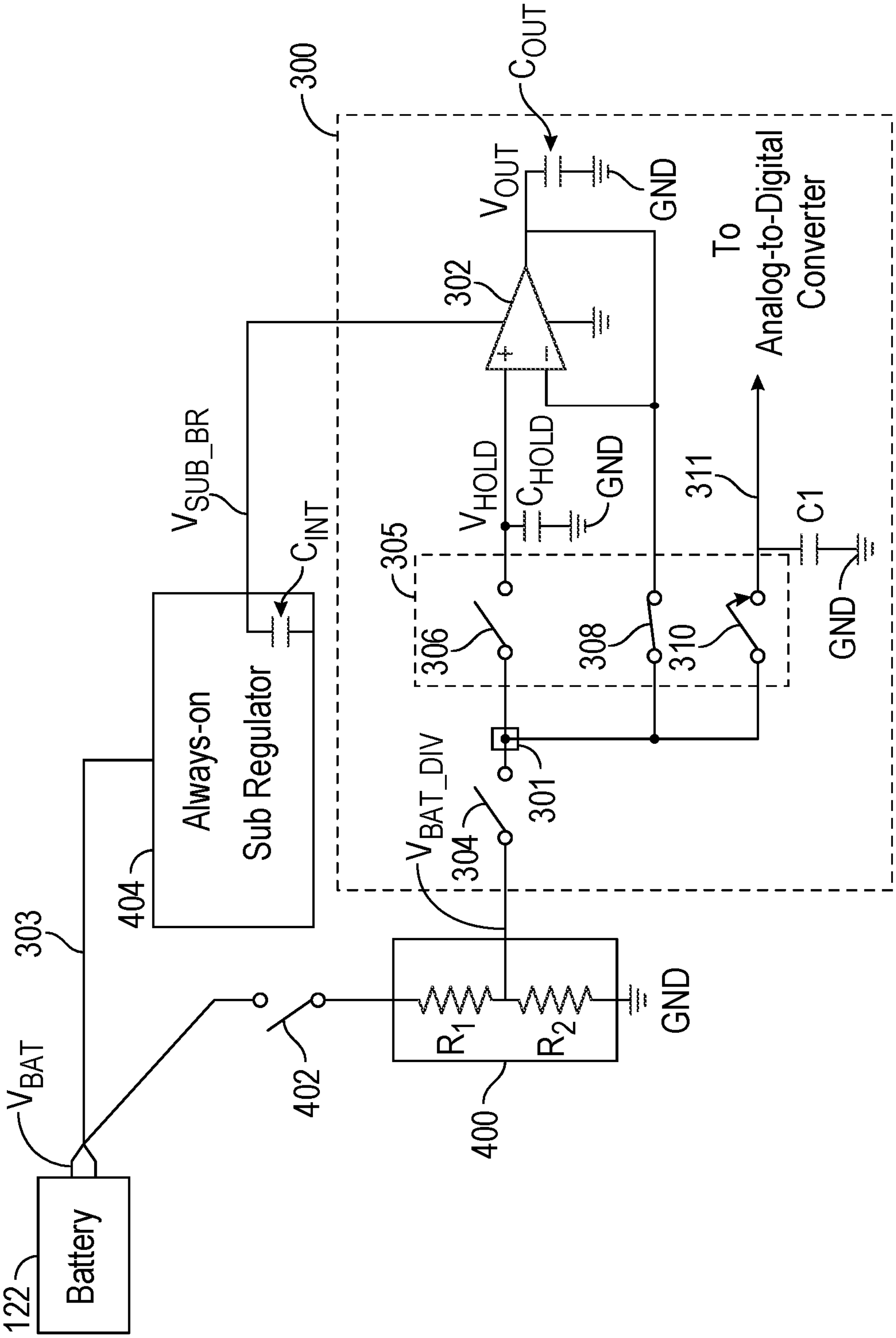
FIG. 3B is a circuit diagram of an example sample-and-hold circuit in a hold configuration, in accordance with certain aspects of the present disclosure.

FIGS. 3A and 3B are circuit diagrams of a sample-and-hold circuit 300 in which aspects of the present disclosure may be implemented. FIG. 3A illustrates the sample-and-hold circuit 300 configured to sample a voltage of the battery (e.g., the battery 122 of the device 100 in FIG. 1) during a sampling phase. FIG. 3B illustrates the sample-and-hold circuit 300 configured to hold the sampled voltage of the battery during a holding phase. It should be understood that the sample-and-hold circuit 300 is included in the device that includes the battery. For example, an IC (e.g., the PMIC 124 discussed above with reference to FIG. 1) may include the sample-and-hold circuit 300. In other words, the sample-and-hold circuit 300 may be used to implement the sample-and-hold circuit 125 of FIG. 1, in certain aspects.

An input 301 of the sample-and-hold circuit 300 may be coupled to the battery 122 via a voltage divider 400, which may include a first resistor $R_1$ and a second resistor $R_2$, as illustrated. An input of the voltage divider 400 may be selectively coupled to a node of the battery 122, specifically a power rail 303 coupled to a terminal of the battery, via a switching device 402. When the switching device 402 is in a first configuration (e.g., closed) as shown in FIG. 3A, the voltage divider 400 may receive a supply voltage $V_{BAT}$ of the battery 122 and output a divided voltage $V_{BAT\_DIV}$ at a tap of the voltage divider 400, where the tap is coupled to the input 301 of the sample-and-hold circuit 300.

It should be understood that a magnitude of the divided voltage $V_{BAT\_DIV}$ of the battery 122 is less than a magnitude of the supply voltage $V_{BAT}$ of the battery 122. For instance, the voltage divider 400 may divide the supply voltage $V_{BAT}$ by a value so that the divided voltage $V_{BAT\_DIV}$ is a fractional representation of the battery voltage $V_{BAT}$ and within range of input voltages for an analog-to-digital converter that is configured to digitize the sampled-and-held version of divided voltage $V_{BAT\_DIV}$ (e.g., held voltage $V_{HOLD}$) of the battery 122 for use in fuel gauging applications, such as estimating a state of charge of the battery 122. In certain aspects of the present disclosure, an error in the value by which the battery voltage $V_{BAT}$ is divided by to generate the divided voltage $V_{BAT\_DIV}$ may be calibrated by applying a known battery voltage during a testing phase for the sample-and-hold circuit 300.

The sample-and-hold circuit 300 may include an amplifier 302 configured to operate as a voltage buffer. The amplifier 302 may receive electrical power from an always-on sub-regulator 404 that is powered by the battery 122 (e.g., has a power supply input coupled to the power rail 303). For example, the always-on sub-regulator 404 may include an internal capacitor $C_{INT}$ (e.g., less than 1 nanofarad) coupled to an output of the regulator and to a power supply input of the amplifier 302. In operation, the internal capacitor $C_{INT}$ may provide a supply current to the power input of the amplifier 302. In this manner, the sample-and-hold circuit 300, specifically the amplifier 302 thereof, may be powered by the battery 122 without a capacitor external to the integrated circuit being coupled to the always-on sub-regulator 404. The purpose of having the always-on sub-regulator 404 without an external capacitor is to power up the sample-and-hold circuit 300 with near-zero inrush current in order to preserve the equilibrium of the battery.

Alternatively, the always-on sub-regulator 404 may not be included in the device. In this case, the node of the battery 122 may be coupled to a power supply input of the sample-and-hold circuit 300, such as the power supply input of the amplifier 302, without an intervening voltage regulator, such as the always-on sub-regulator 404.

The sample-and-hold circuit 300 may include a switching device 304 configured to selectively couple the input 301 of the sample-and-hold circuit 300 to the tap of the voltage divider 400 to sample the divided voltage $V_{BAT\_DIV}$. For instance, the input 301 of the sample-and-hold circuit 300 may be coupled to the tap of the voltage divider 400 when the switching device 304 is in a first configuration (e.g., closed) as shown in the sampling phase of FIG. 3A. Conversely, the input 301 of the sample-and-hold circuit 300 may be decoupled from the tap of the voltage divider 400 when the switching device 304 is in a second configuration (e.g., open) as shown in the holding phase of FIG. 3B.

The sample-and-hold circuit 300 may include a switching network 305. As shown, the switching network 305 may include a first switching device 306 coupled between the input 301 of the sample-and-hold circuit 300 and a positive input of the amplifier 302. The switching network 305 may include a second switching device 308 coupled between the input 301 of the sample-and-hold circuit 300 and a negative input of the amplifier 302, which is coupled to (e.g., shorted) to an output of the amplifier 302. The switching network 305 may include a third switching device 310 coupled between the input 301 of the sample-and-hold circuit 300 and an output 311 of the sample-and-hold circuit 300 that is, for example, coupled to an input of the analog-to-digital converter.

The sample-and-hold circuit 300 may be configured to sample the battery voltage $V_{BAT}$ (or a version of $V_{BAT}$, such as the divided voltage $V_{BAT\_DIV}$) before the battery 122 is loaded. More particularly, the sample-and-hold circuit 300 may be configured to sample the battery voltage $V_{BAT}$ before one or more power supply circuits (e.g., other than the always-on sub-regulator 404) are enabled to generate a power supply voltage for powering circuits other than the sample-and-hold circuit 300. In this manner, the divided voltage $V_{BAT\_DIV}$ obtained by the sample-and-hold circuit 300 may correspond to a more accurate representation of a true open circuit voltage of the battery 122, which may be used to accurately estimate a state of charge of the battery 122.

To sample the battery voltage $V_{BAT}$ before the battery 122 is loaded (e.g., before the boot-up sequence), the switching device 402 may be in the first configuration (e.g., closed) as shown in FIG. 3A to couple the voltage divider 400 to the battery 122, or at least to the power rail 303 coupled thereto. In addition, the switching device 304 of the sample-and-hold circuit 300 may be in the first configuration (e.g., closed) as shown in FIG. 3A to couple the input 301 of the sample-and-hold circuit 300 to the tap of the voltage divider 400. In this manner, the input 301 of the sample-and-hold circuit 300 may receive and sample the divided battery voltage $V_{BAT\_DIV}$ of the battery 122 that is output at the tap of the voltage divider 400.

Furthermore, to sample the battery voltage $V_{BAT}$ before the battery 122 is loaded (e.g., before the boot-up sequence), the first, second, and third switching devices 306, 308, 310 of the switching network 305 are configured as shown in FIG. 3A. More specifically, the first switching device 306 is in the first configuration (e.g., closed) to provide an electrical path from the input 301 of the sample-and-hold circuit 300 to the positive input of the amplifier 302, whereas the second switching device 308 and the third switching device 310 are each in a second configuration (e.g., open). In this manner, a holding capacitor $C_{HOLD}$ (e.g., a capacitive element) coupled to ground GND and the positive input of the amplifier 302 may be charged during the sampling phase so that a voltage $V_{HOLD}$ across the holding capacitor $C_{HOLD}$ corresponds to the divided voltage $V_{BAT\_DIV}$ of the battery 122. The capacitance of the holding capacitor $C_{HOLD}$ may depend on the hold time and/or leakage associated with one or more switching devices (e.g., first switching device 306) of the sample-and-hold circuit 300.

To store the sampled divided voltage $V_{BAT\_DIV}$ on the holding capacitor $C_{HOLD}$, the switching device 402 coupled to the battery 122 and the switching device 304 of the sample-and-hold circuit 300 both transition to the second configuration (e.g., open) as shown in FIG. 3B. In addition, during the holding phase depicted in FIG. 3B, the first switching device 306 and the third switching device 310 of the switching network 305 are each in the second configuration (e.g., open), whereas the second switching device 308 of the switching network 305 is in the first configuration (e.g., closed).

The holding capacitor $C_{HOLD}$ may be configured to store the sampled divided voltage $V_{BAT\_DIV}$ as held voltage $V_{HOLD}$ during a boot-up sequence in which the battery 122 is loaded (e.g., no longer in equilibrium). For example, the battery 122 may supply power to other circuits of the device 100, such as the analog-to-digital converter that, as discussed above, digitizes an equivalent of the sampled-and-held voltage $V_{HOLD}$ stored on the holding capacitor $C_{HOLD}$. According to certain aspects of the present disclosure, the holding capacitor $C_{HOLD}$ may be configured to store the sampled-and-held voltage $V_{HOLD}$ for a minimum amount of time (e.g., at least 400 milliseconds) to allow the analog-to-digital converter to be powered on so that after the third switch 310 is closed, the analog-to-digital converter may receive the output voltage $V_{OUT}$ of the amplifier 302, which matches the held voltage $V_{HOLD}$ stored by the holding capacitor $C_{HOLD}$ (e.g., within an offset voltage of the amplifier 302). The analog-to-digital converter may then digitize the output voltage $V_{OUT}$ for fuel gauging purposes, such as estimating a state of charge of the battery 122 and, depending on the estimated state of charge of the battery, performing one or more actions related to battery management.

As shown, the sample-and-hold circuit 300 may include an output capacitor $C_{OUT}$ (e.g., a capacitive element) coupled in shunt to the output of the amplifier 302. The output capacitor $C_{OUT}$ may allow for smooth switching transitions. Additionally, the output capacitor $C_{OUT}$ may improve supply rejection. The sample-and-hold circuit 300 may also include a capacitor $C_1$ (e.g., a capacitive element) coupled to ground GND and the third switching device 310. The capacitor $C_1$ may, for example, have a capacitance of 1 picofarad.

Figure 4:
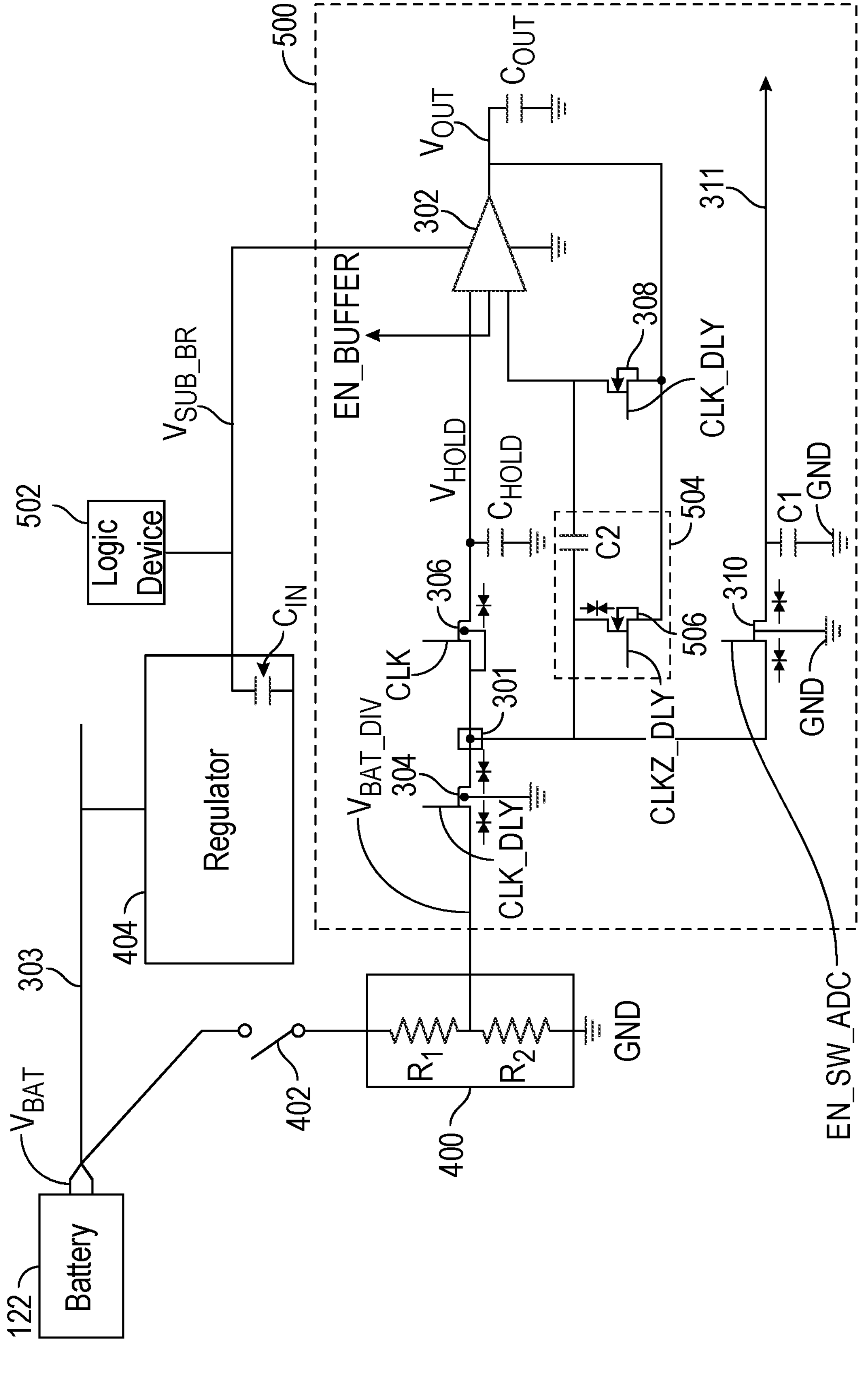
FIG. 4 is a circuit diagram of an example sample-and-hold circuit with an autozeroing circuit, in accordance with certain aspects of the present disclosure.

FIG. 4 illustrates a circuit diagram of a sample-and-hold circuit 500 according to certain aspects of the present disclosure. The sample-and-hold circuit 500 may be substantially similar to the sample-and-hold circuit 300 discussed above with reference to FIGS. 3A and 3B. To that end, reference numbers for components of the sample-and-hold circuit 300 in FIGS. 3A and 3B that are also included in the sample-and-hold circuit 500 of FIG. 4 will be reused for simplicity.

A logic device 502 (e.g., a controller)—which may not be part of the sample-and-hold circuit 500—may be coupled to the always-on sub-regulator 404. In this manner, the logic device 502 may be powered on before significantly loading the battery 122 and may control components of the sample-and-hold circuit 500 to sample the divided voltage $V_{BAT\_DIV}$ of the battery 122 before loading the battery 122 and to hold the sampled voltage as held voltage $V_{HOLD}$ until a boot-up sequence for the battery-powered device enables an analog-to-digital converter to digitize the buffered version ($V_{OUT}$) of the held voltage $V_{HOLD}$. The digitized representation of the battery voltage may be used in fuel gauging applications, such as estimating a state of charge of the battery 122, to, for example, control operation of the device 100 (FIG. 1) based on the estimated state of charge of the battery 122. Furthermore, with the analog-to-digital converter enabled and the battery 122 loaded, the sample-and-hold circuit 500 may be calibrated to improve the accuracy of the measurement of the sampled divided voltage $V_{BAT\_DIV}$.

The logic device 502 may receive power from the always-on sub-regulator 404. Alternatively, the always-on sub-regulator 404 may not be included in the device, and in this case, a power supply input of the logic device 502 may instead be coupled to a node of the battery 122, specifically the power rail 303 thereof. In this manner, the logic device 502 may be powered without an intervening voltage regulator, such as the always-on sub-regulator 404.

The logic device 502 may output an enable buffer signal EN_BUFFER to the amplifier 302 (and in some cases, to the switching device 402 or to a switching device internal to the voltage divider 400). The logic device 502 may also output a clock signal CLK and a delayed clock signal CLK_DLY. The clock signal CLK may be output to the first switching device 306 of the switching network 305 (FIGS. 3A and 3B) to control operation of the first switching device 306 while sampling the battery voltage and holding the sampled battery voltage. The delayed clock signal CLK_DLY may be output to the switching device 304 to control operation of the switching device 304 during the sampling and holding phases. The delayed clock signal CLK_DLY may also be output to the second switching device 308 of the switching network (FIGS. 3A and 3B). By providing the clock signal CLK to the first switching device 306 and the delayed clock signal CLK_DLY to the switching device 304 and the second switching device 308, the hold capacitor $C_{HOLD}$ may be disconnected from the input 301 before disconnecting the voltage divider 400 and applying the output voltage $V_{OUT}$ of the amplifier 302 to the input 301 of the sample-and-hold circuit 500. In this manner, the held voltage $V_{HOLD}$ on the holding capacitor $C_{HOLD}$ may be improved (e.g., a more accurate representation of the sampled divided voltage $V_{BAT\_DIV}$).

As shown, the sample-and-hold circuit 500 may include an autozeroing circuit 504. The autozeroing circuit 504 may be configured to autozero the sample-and-hold circuit 500 before holding the sampled divided voltage $V_{BAT\_DIV}$. In this manner, the autozeroing circuit 504 may reduce a voltage offset error of the sample-and-hold circuit 500, specifically the amplifier 302 thereof. The autozeroing circuit 504 may include a capacitive element C2 (an autozeroing capacitive element) and a switching device 506. The capacitive element C2 (e.g., having a capacitance of 10 picofarads) may be coupled between the input 301 of the sample-and-hold circuit 500 and the negative input of the amplifier 302. The switching device 506 may be coupled between the input 301 of the sample-and hold circuit 500 and the output of the amplifier 302. The switching device 506 may be implemented by an n-type field-effect transistor (NFET), as shown. Furthermore, the switching device 506 may be controlled by an inverse delayed clock signal CLKZ_DLY, which is the logical inverse of the delayed clock signal CLK_DLY. For instance, the inverse delayed clock signal CLKZ_DLY may control operation of the switching device 506 to autozero the sample-and-hold circuit 500 before holding the sampled divided voltage $V_{BAT\_DIV}$ to, as mentioned above, reduce a voltage offset error of the amplifier 302.

The logic device 502 may also generate an enable signal EN_SW_ADC to control operation of the third switching device 310 in the switching network 305 (FIGS. 3A and 3B). The third switching device 310 may be implemented by a p-type field-effect transistor (PFET), as shown. More specifically, the logic device 502 may provide the enable signal EN_SW_ADC to the third switching device 310 to configure the third switching device 310 in the first configuration (e.g., closed) to provide an electrical path from the holding capacitor $C_{HOLD}$ to the output 311 of the sample-and-hold circuit 500. In this manner, an analog-to-digital converter coupled to the output 311 of the sample-and-hold circuit 500 may digitize the held voltage and subsequently use the digitized voltage to, for example, estimate a state of charge of the battery 122 for use in fuel gauging applications.

It should be understood that the switching devices 304, 306, 308, 310, 506 of the sample-and-hold circuit 500 may include any suitable configuration of transistors or other suitable devices for opening and closing connections between components. For example, in certain aspects of the present disclosure, one or more of the switching devices 304, 306, 308, 310, 506 may include transmission gates. Alternatively, or additionally, one or more of the switching devices 304, 306, 308, 310, 506 may include back-to-back field effect transistors (FETs).

Example Timing Diagram for a Sample-and-Hold Circuit

Figure 5:
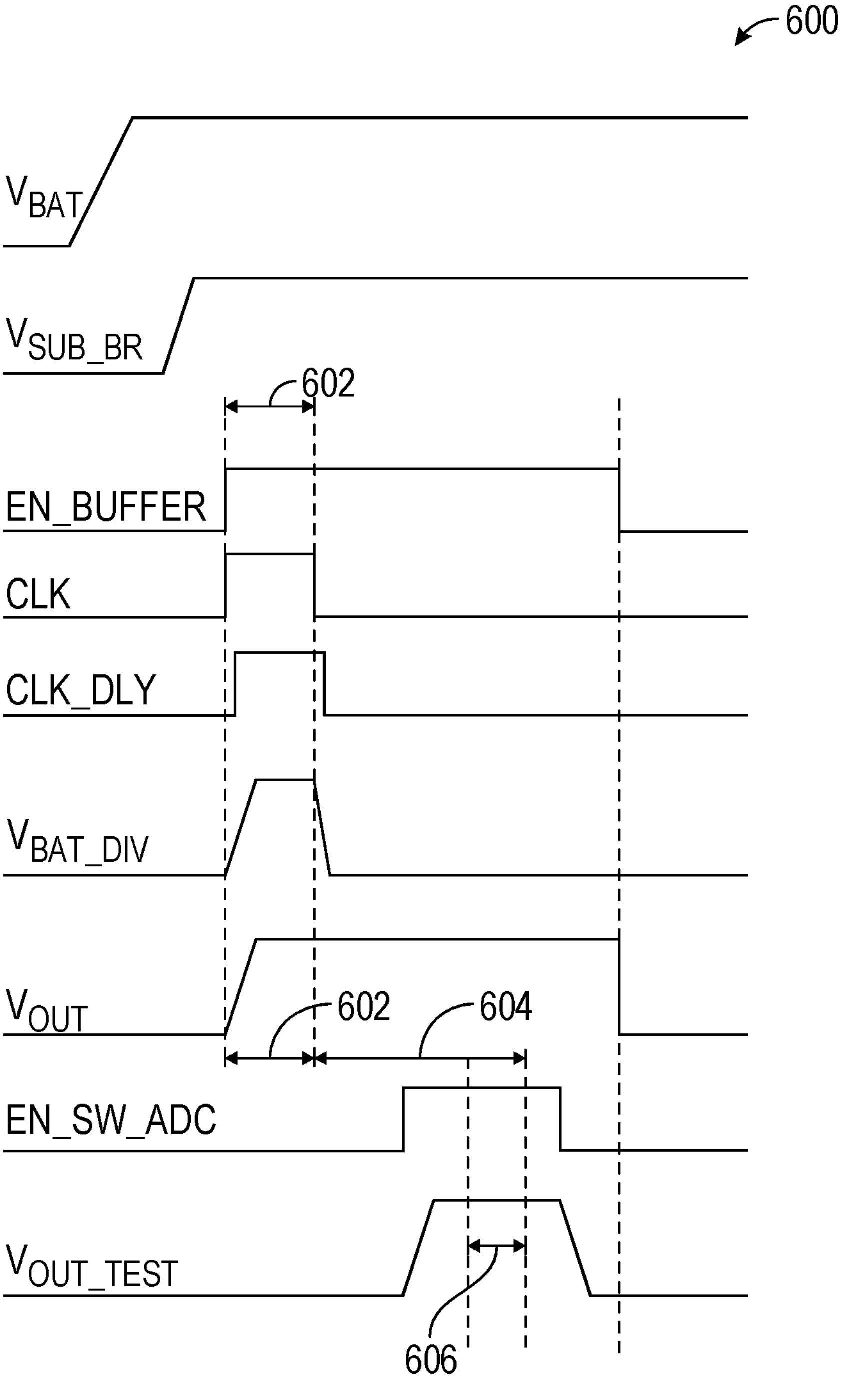
FIG. 5 is an example timing diagram of the sample-and-hold circuit of FIG. 4, in accordance with certain aspects of the present disclosure.

FIG. 5 illustrates an example timing diagram 600 for a sample-and-hold circuit according to certain aspects of the present disclosure. For instance, the timing diagram 600 may be for the sample-and-hold circuit 500 discussed above with reference to FIG. 4. It should be appreciated, however, that the timing diagram 600 may be applicable to other sample-and-hold circuits in accordance with aspects of the present disclosure, such as the sample-and-hold circuit 300 of FIGS. 3A and 3B.

As shown in the timing diagram 600, after the device is powered on, the always-on sub-regulator 404 turns on and generates a power supply voltage VSUB_BR from the power rail 303 with battery voltage $V_{BAT}$ to power the sample-and-hold circuit 500, including the logic device 502. The logic device 502 outputs an enable buffer signal EN_BUFFER to enable the amplifier 302 for sampling, holding, and digitizing (a representation of) the battery voltage. The clock signal CLK output by the logic device 502 controls a duration of a sample period 602 before the battery 122 is significantly loaded (e.g., before boot-up) and during which the sample-and-hold circuit 500 samples the divided voltage $V_{BAT\_DIV}$ of the battery 122 and charges the holding capacitor $C_{HOLD}$ up to the divided voltage $V_{BAT\_DIV}$. More specifically, a beginning of the sample period 602 coincides with a rising edge of the clock signal CLK, and an end of the sample period 602 coincides with a falling edge of the clock signal CLK. The duration of the sample period 602 may, for example, be 1 millisecond. During the sample period 602, the rising edge of the delayed clock signal CLK_DLY (delayed from the rising edge of the clock signal CLK) closes the second switching device 308 to short the negative input and the output of the amplifier 302. Thereafter, the amplifier 302 generates an output voltage $V_{OUT}$ that matches the held voltage $V_{HOLD}$ at the positive input of the amplifier, where these voltages rise together as shown in the timing diagram 600.

A hold period 604 may follow the sample period 602, where the switching devices 304, 306 are opened. During the hold period 604, the holding capacitor $C_{HOLD}$ holds the value of the sampled divided voltage $V_{BAT\_DIV}$ at the end of the sample period 602, and the output voltage $V_{OUT}$ of the amplifier 302 remains constant as the amplifier drives its output such that the held voltage $V_{HOLD}$ at the positive input of the amplifier 302 matches a voltage at the negative input of the amplifier 302.

During the hold period 604 (e.g., up to 400 milliseconds), the logic device 502 outputs the enable signal EN_SW_ADC to the third switching device 310 (FIG. 4) included in the switching network of the sample-and-hold circuit 500. In this manner, the output voltage $V_{OUT}$ of the amplifier 302, which corresponds to the held voltage $V_{HOLD}$ stored on the holding capacitor $C_{HOLD}$, is provided to the output 311 of the sample-and-hold circuit 500 as voltage signal $V_{OUT\_TEST}$. Furthermore, an analog-to-digital converter that is coupled to the output 311 of the sample-and-hold circuit 500 may receive and digitize the voltage signal $V_{OUT\_TEST}$. As shown, a digitization period 606 occurring between the rising edge of the voltage signal $V_{OUT\_TEST}$ and the falling edge of the voltage signal $V_{OUT\_TEST}$ represents a period of time during which the analog-to-digital converter digitizes the voltage signal $V_{OUT\_TEST}$, thereby providing a representation (e.g., a divided version) of the true OCV of the battery, on which an accurate state of charge of the battery may be estimated.

Example Operations for Supplying Power

Figure 6:
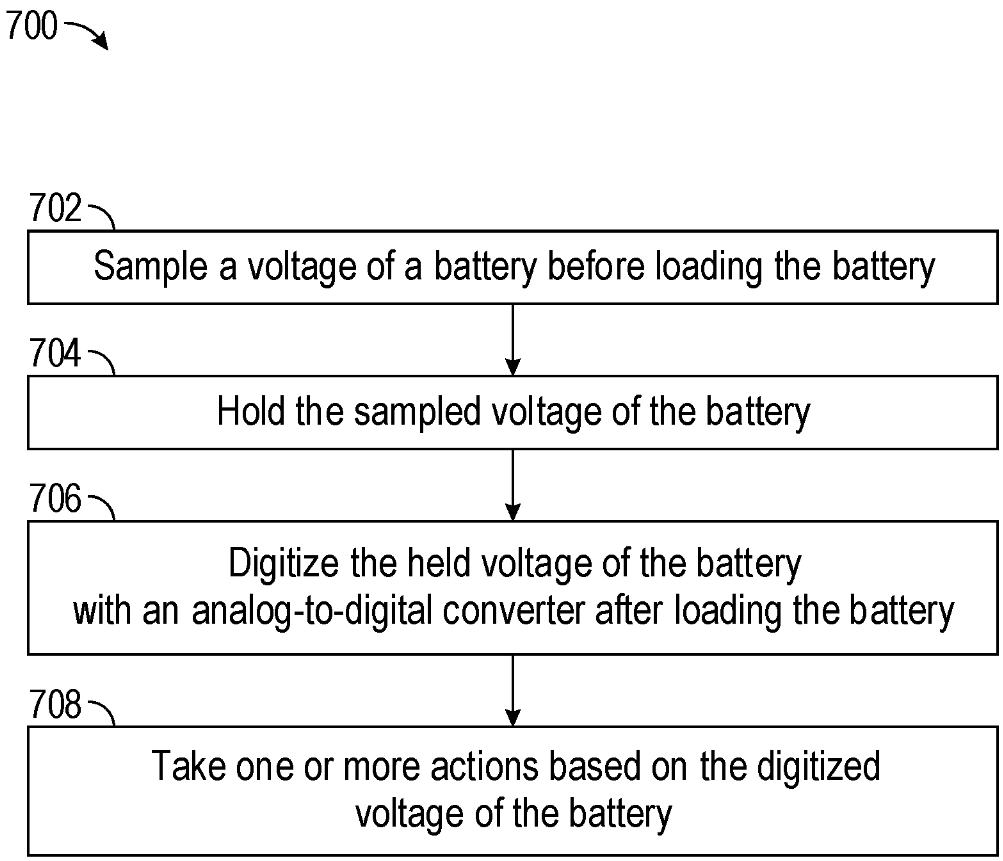
FIG. 6 is a flow diagram illustrating example operations for supplying power, in accordance with certain aspects of the present disclosure.

FIG. 6 is a flow diagram illustrating example operations 700 for supplying power with a battery, in accordance with certain aspects of the present disclosure. The operations 700 may be performed, for example, by a circuit (e.g., an IC, such as a PMIC 124) with a sample-and-hold circuit (e.g., the sample-and-hold circuits 125, 300, 500 discussed above with reference to FIGS. 1, 3A, 3B, and 5).

The operations 700 may begin, at block 702, with sampling a voltage (e.g., VBAT) of a battery (e.g., battery 122) before loading the battery. The operations 700 may also involve holding the sampled voltage of the battery at block 704.

After loading the battery, the operations 700 may further involve digitizing the held voltage of the battery with an analog-to-digital converter (ADC) at block 706. At block 708, the operations 700 may further involve taking one or more actions based on the digitized voltage of the battery. For example, the one or more actions may include storing the digitized voltage of the battery in a memory (e.g., memory 106). Alternatively, or additionally, the one or more actions may include determining a state of charge of the battery based on the digitized voltage of the battery and/or limiting one or more capabilities of a device powered by the battery based on the digitized voltage of the battery being below a threshold voltage.

According to certain aspects, the sampling at block 702 involves sampling the voltage of the battery with a sample-and-hold circuit (e.g., sample-and-hold circuit 300, 500) of an integrated circuit (IC) before enabling one or more other circuits of the IC, the one or more other circuits including the ADC. For certain aspects, the IC includes a system on a chip (SoC). In this case, the sampling at block 702 may involve sampling the voltage of the battery before booting up the SoC, and the digitizing at block 706 may include digitizing the held voltage of the battery with the ADC after booting up the SoC. For certain aspects, the sampling at block 702 may involve sampling the voltage of the battery without any inrush currents due to loading the battery with the one or more other circuits of the IC. For certain aspects, the operations 700 further include powering the sample-and-hold circuit from the battery without an intervening voltage regulator. For other aspects, the operations 700 further involve powering the sample-and-hold circuit from an always-on sub-regulator (e.g., sub-regulator 404) powered by the battery. In some cases, the sample-and-hold circuit may be powered without a capacitor external to the IC being coupled to an output of the sub-regulator. For certain aspects, the sampling at block 702 involves sampling the voltage of the battery before generating a power supply voltage with a voltage regulator (e.g., an LDO) coupled to the battery. In this case, the power supply voltage may be used for powering at least one of the other circuits of the IC, and the voltage regulator may be enabled after the sampling at block 702.

Accordingly to certain aspects, the sampling at block 702 includes sampling the voltage of the battery with a sample-and-hold circuit, and the holding at block 704 includes holding the sampled voltage of the battery with the sample-and-hold circuit. In this case, the operations 700 may further involve auto-zeroing the sample-and-hold circuit before the holding at block 704 to reduce a voltage offset error of the sample-and-hold circuit.

Accordingly to certain aspects, the operations 700 may further involve dividing down the voltage of the battery before the sampling. In this case, the sampled voltage may be a fractional representation of the voltage of the battery.

Example Aspects

In addition to the various aspects described above, specific combinations of aspects are within the scope of the disclosure, some of which are detailed below:

Aspect 1: A method comprising: sampling a voltage of a battery before loading the battery; holding the sampled voltage of the battery; digitizing the held voltage of the battery with an analog-to-digital converter (ADC) after loading the battery; and taking one or more actions based on the digitized voltage of the battery.

Aspect 2: The method of Aspect 1, wherein the sampling comprises sampling the voltage of the battery with a sample-and-hold circuit of an integrated circuit (IC) before enabling one or more other circuits of the IC, the one or more other circuits including the ADC.

Aspect 3: The method of Aspect 2, wherein the IC comprises a system on a chip (SoC), wherein the sampling comprises sampling the voltage of the battery before booting up the SoC, and wherein the digitizing comprises digitizing the held voltage of the battery with the ADC after booting up the SoC.

Aspect 4: The method of Aspect 2, wherein the sampling comprises sampling the voltage of the battery without any inrush currents due to loading the battery with the one or more other circuits of the IC.

Aspect 5: The method of Aspect 2, further comprising: powering the sample-and-hold circuit from the battery without an intervening voltage regulator.

Aspect 6: The method of Aspect 2, further comprising: powering the sample-and-hold circuit from an always-on sub-regulator powered by the battery without a capacitor external to the IC being coupled to an output of the sub-regulator.

Aspect 7: The method of Aspect 2, wherein the sampling comprises sampling the voltage of the battery before generating a power supply voltage with a voltage regulator coupled to the battery, the power supply voltage for powering at least one of the other circuits of the IC and the voltage regulator being enabled after the sampling.

Aspect 8: The method of any of Aspects 1 to 7, wherein taking the one or more actions comprises storing the digitized voltage of the battery in a memory.

Aspect 9: The method of any of Aspects 1 to 8, wherein taking the one or more actions comprises determining a state of charge of the battery based on the digitized voltage of the battery.

Aspect 10: The method of any of Aspects 1 to 9, wherein taking the one or more actions comprises limiting one or more capabilities of a device powered by the battery based on the digitized voltage of the battery being below a threshold voltage.

Aspect 11: The method of any of Aspects 1 to 10, further comprising: dividing down the voltage of the battery before the sampling such that the sampled voltage is a fractional representation of the voltage of the battery, wherein the fractional representation corresponds to a range of input voltages for the analog-to-digital converter.

Aspect 12: The method of any of Aspects 1 to 11, wherein the sampling comprises sampling the voltage of the battery with a sample-and-hold circuit, wherein the holding comprises holding the sampled voltage of the battery with the sample-and-hold circuit, and where the method further comprises auto-zeroing the sample-and-hold circuit before the holding to reduce a voltage offset error of the sample-and-hold circuit.

Aspect 13: An apparatus comprising: a sample-and-hold circuit configured to sample a voltage of a battery before loading the battery and to hold the sampled voltage of the battery; an analog-to-digital converter (ADC) selectively coupled to an output of the sample-and-hold circuit and configured to digitize the held voltage of the battery; and a controller configured to enable the ADC for digitizing the held voltage of the battery after the sample-and-hold circuit samples the voltage of the battery.

Aspect 14: The apparatus of Aspect 13, wherein the controller has an input coupled to an output of the ADC, the controller being further configured to take one or more actions based on the digitized voltage of the battery.

Aspect 15: The apparatus of Aspect 13 or 14, wherein a node for the battery is coupled to a power supply input of the sample-and-hold circuit without an intervening voltage regulator.

Aspect 16: The apparatus of any of Aspects 13 to 15, further comprising: an always-on sub-regulator having an input coupled to a node for the battery and having an output coupled to a power supply input of the sample-and-hold circuit.

Aspect 17: The apparatus of any of Aspects 13 to 16, wherein the sample-and-hold circuit comprises: an amplifier; a first capacitive element coupled to a positive input of the amplifier; a first switch coupled between an input of the sample-and-hold circuit and the positive input of the amplifier; a second switch coupled between a negative input of the amplifier and an output of the amplifier; a second capacitive element coupled between the input of the sample-and-hold circuit and the negative input of the amplifier; and a third switch coupled between the input of the sample-and-hold circuit and the output of the amplifier.

Aspect 18: The apparatus of Aspect 17, wherein a power supply input of the amplifier is coupled to: a node for the battery without an intervening voltage regulator; or an output of an always-on sub-regulator having an input coupled to the node for the battery.

Aspect 19: The apparatus of any of Aspects 13 to 17, further comprising: a voltage divider having an input selectively coupled to a node for the battery and having a tap selectively coupled to an input of the sample-and-hold circuit.

Aspect 20: An apparatus comprising: means for sampling a voltage of a battery before loading the battery; means for holding the sampled voltage of the battery; means for digitizing the held voltage of the battery after loading the battery; and means for taking one or more actions based on the digitized voltage of the battery.

Additional Considerations

The various operations of methods described above may be performed by any suitable means capable of performing the corresponding functions. The means may include various hardware and/or software component(s) and/or module(s), including, but not limited to a circuit, an application-specific integrated circuit (ASIC), or a processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

What is claimed is:

1. A method comprising:

sampling a voltage of a battery before loading the battery;

holding the sampled voltage of the battery;

digitizing the held voltage of the battery with an analog-to-digital converter (ADC) after loading the battery; and taking one or more actions based on the digitized voltage of the battery.

2. The method of claim 1, wherein the sampling comprises sampling the voltage of the battery with a sample-and-hold circuit of an integrated circuit (IC) before enabling one or more other circuits of the IC, the one or more other circuits including the ADC.

3. The method of claim 2, wherein the IC comprises a system on a chip (SoC), wherein the sampling comprises sampling the voltage of the battery before booting up the SoC, and wherein the digitizing comprises digitizing the held voltage of the battery with the ADC after booting up the SoC.

4. The method of claim 2, wherein the sampling comprises sampling the voltage of the battery without any inrush currents due to loading the battery with the one or more other circuits of the IC.

5. The method of claim 2, further comprising powering the sample-and-hold circuit from the battery without an intervening voltage regulator.

6. The method of claim 2, further comprising powering the sample-and-hold circuit from an always-on sub-regulator powered by the battery without a capacitor external to the IC being coupled to an output of the sub-regulator.

7. The method of claim 2, wherein the sampling comprises sampling the voltage of the battery before generating a power supply voltage with a voltage regulator coupled to the battery, the power supply voltage for powering at least one of the other circuits of the IC and the voltage regulator being enabled after the sampling.

8. The method of claim 1, wherein taking the one or more actions comprises storing the digitized voltage of the battery in a memory.

9. The method of claim 1, wherein taking the one or more actions comprises determining a state of charge of the battery based on the digitized voltage of the battery.

10. The method of claim 1, wherein taking the one or more actions comprises limiting one or more capabilities of a device powered by the battery based on the digitized voltage of the battery being below a threshold voltage.

11. The method of claim 1, further comprising dividing down the voltage of the battery before the sampling such that the sampled voltage is a fractional representation of the voltage of the battery, wherein the fractional representation corresponds to a range of input voltages for the analog-to-digital converter.

12. The method of claim 1, wherein the sampling comprises sampling the voltage of the battery with a sample-and-hold circuit, wherein the holding comprises holding the sampled voltage of the battery with the sample-and-hold circuit, and wherein the method further comprises auto-zeroing the sample-and-hold circuit before the holding to reduce a voltage offset error of the sample-and-hold circuit.

13. An apparatus comprising:

a sample-and-hold circuit configured to sample a voltage of a battery before loading the battery and to hold the sampled voltage of the battery;

an analog-to-digital converter (ADC) selectively coupled to an output of the sample-and-hold circuit and configured to digitize the held voltage of the battery; and a controller configured to enable the ADC for digitizing the held voltage of the battery after the sample-and-hold circuit samples the voltage of the battery.

14. The apparatus of claim 13, wherein the controller has an input coupled to an output of the ADC, the controller being further configured to take one or more actions based on the digitized voltage of the battery.

15. The apparatus of claim 13, wherein a node for the battery is coupled to a power supply input of the sample-and-hold circuit without an intervening voltage regulator.

16. The apparatus of claim 13, further comprising an always-on sub-regulator having an input coupled to a node for the battery and having an output coupled to a power supply input of the sample-and-hold circuit.

17. The apparatus of claim 13, wherein the sample-and-hold circuit comprises:

an amplifier;

a first capacitive element coupled to a positive input of the amplifier;

a first switch coupled between an input of the sample-and-hold circuit and the positive input of the amplifier;

a second switch coupled between a negative input of the amplifier and an output of the amplifier;

a second capacitive element coupled between the input of the sample-and-hold circuit and the negative input of the amplifier; and a third switch coupled between the input of the sample-and-hold circuit and the output of the amplifier.

18. The apparatus of claim 17, wherein a power supply input of the amplifier is coupled to:

a node for the battery without an intervening voltage regulator; or an output of an always-on sub-regulator having an input coupled to the node for the battery.

19. The apparatus of claim 13, further comprising a voltage divider having an input selectively coupled to a node for the battery and having a tap selectively coupled to an input of the sample-and-hold circuit.

20. An apparatus comprising:

means for sampling a voltage of a battery before loading the battery;

means for holding the sampled voltage of the battery;

means for digitizing the held voltage of the battery after loading the battery; and means for taking one or more actions based on the digitized voltage of the battery.

* * * * *